United States Patent
Chen et al.

(10) Patent No.: US 10,032,489 B1
(45) Date of Patent: Jul. 24, 2018

(54) SENSING AMPLIFIER TO DETECT THE MEMORY CELL CURRENT TRANSITION

(71) Applicant: SanDisk Technologies LLC, Plano, TX (US)

(72) Inventors: Yingchang Chen, Milpitas, CA (US); Xiaoxia Wu, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/459,857

(22) Filed: Mar. 15, 2017

(51) Int. Cl.
*G11C 5/14* (2006.01)
*G11C 7/02* (2006.01)
*G11C 7/06* (2006.01)
*G11C 7/12* (2006.01)

(52) U.S. Cl.
CPC . *G11C 7/06* (2013.01); *G11C 7/12* (2013.01)

(58) Field of Classification Search
None
See application file for complete search history.

(56) References Cited

U.S. PATENT DOCUMENTS

| | | | |
|---|---|---|---|
| 5,293,333 A * | 3/1994 | Hashimoto | G11C 16/26 365/185.21 |
| 5,541,869 A | 7/1996 | Rose et al. | |
| 5,915,167 A | 6/1999 | Leedy | |
| 6,072,716 A | 6/2000 | Jacobson et al. | |
| 6,473,332 B1 | 10/2002 | Ignatiev | |
| 7,245,543 B2 | 7/2007 | Oh et al. | |
| 7,251,178 B2 | 7/2007 | Gogl et al. | |
| 7,433,253 B2 | 10/2008 | Gogl et al. | |
| 7,920,407 B2 | 4/2011 | Chen et al. | |
| 8,385,109 B2 | 2/2013 | Park | |
| 9,053,788 B2 | 6/2015 | Azuma et al. | |
| 9,070,424 B2 | 6/2015 | Youn et al. | |
| 9,082,478 B2 | 7/2015 | Lee et al. | |
| 9,153,316 B1 | 10/2015 | Ryu | |
| 9,196,358 B2 | 11/2015 | Lee et al. | |
| 9,728,231 B1 * | 8/2017 | Lee | G11C 5/147 |
| 2003/0045054 A1 | 3/2003 | Campbell et al. | |
| 2003/0047765 A1 | 3/2003 | Campbell | |
| 2005/0232001 A1 * | 10/2005 | Tsuji | G11C 11/16 365/158 |
| 2005/0253569 A1 * | 11/2005 | Sugiura | G05F 1/565 323/282 |
| 2008/0175059 A1 * | 7/2008 | Kim | G11C 11/5642 365/185.12 |
| 2009/0027953 A1 | 1/2009 | Kang et al. | |
| 2009/0086534 A1 | 4/2009 | Debrosse et al. | |
| 2009/0323391 A1 | 12/2009 | Scheuerlein et al. | |

(Continued)

*Primary Examiner* — Son Dinh
*Assistant Examiner* — Sultana Begum
(74) *Attorney, Agent, or Firm* — Foley & Lardner LLP

(57) ABSTRACT

This disclosure provides a method and apparatus for detecting a transition of a memory cell current from a first state to a second state. An example apparatus includes a memory cell, a supplemental current source, a comparator, a reference voltage and a reference current source in a configuration that allows for real time detection of the transition of a memory cell. Detection of a memory cell current transition is captured when the output of the comparator transitions from one state to a second state in response to a sensing voltage exceeding the reference voltage.

19 Claims, 10 Drawing Sheets

(56) References Cited

U.S. PATENT DOCUMENTS

| | | | |
|---|---|---|---|
| 2010/0103726 A1* | 4/2010 | Bae | G11C 5/143 |
| | | | 365/163 |
| 2011/0178768 A1 | 7/2011 | Jung et al. | |
| 2015/0302922 A1 | 10/2015 | Wang et al. | |
| 2016/0061880 A1* | 3/2016 | Uppal | G01R 31/12 |
| | | | 324/762.01 |

* cited by examiner

SENSING AMPLIFIER TO DETECT THE MEMORY CELL CURRENT TRANSITION

BACKGROUND

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers want the semiconductor memory to perform reliably at sufficient speeds. Therefore, real time monitoring of non-volatile memory is imperative to more reliable data and a better customer experience.

SUMMARY

The systems, methods and devices of this disclosure each have several innovative aspects, no single one of which is solely responsible for the desirable attributes disclosed herein.

One innovative aspect of the subject matter described in this disclosure can be implemented in an apparatus including an electronic circuit. The electronic circuit includes a memory cell, a sensing voltage node, a bit line connecting the memory cell and the sensing voltage node, and a comparator. The comparator may be an operational amplifier that has a reference voltage connected to its negative input, and the sensing voltage node connected to its positive input. The output of the comparator is a detection signal that is based upon the comparison of the voltage at the sensing voltage node to the reference voltage. The operational amplifier is a means for detecting a transition of the memory cell from a first current state to a second current state in response to a sensing voltage exceeding a reference voltage. In alternative embodiments, the means for detecting a transition from a first current state to a second current state via the comparison of the sensing voltage to a reference voltage can be implemented by software, multiple operational amplifiers, transistors, a combination thereof, or any other means known in the art.

The electronic circuit includes a reference current source connected to the sensing voltage node and provides a reference current to the sensing voltage node. The reference current source is a means for providing a reference current. In alternative embodiments, the means for providing a reference current may be an active current source, a passive current source, a constant current diode, a Zener diode current source, an LED current source, a transistor current source with diode compensation, a current mirror, an operational amplifier current source, a voltage regulator current source, a combination thereof, or any other current source that is known in the art.

A supplemental current transistor is connected in parallel to the reference current source and may provide a supplemental current to the sensing voltage node when a current through the memory cell exceeds the reference current. In other words, the reference current is used as a constant current threshold, and the supplemental current is provided to ensure that the inflowing current (i.e., the supplemental current and the reference current) to the voltage sensing node is equal to the outflowing current (i.e., the memory cell current) without affecting the voltage at the voltage sensing node. The gate of the supplemental current transistor is connected to a gate voltage that is selectively controlled. The supplemental current transistor may be implemented as an n-MOS transistor. In an embodiment, the n-MOS supplemental current transistor is a means for selectively providing supplemental current to the bit line associated with the memory cell. The means for selectively providing supplemental current further includes a means for activating the supplemental current in response to an amount of current on the bit line exceeding an amount of the reference current. Further, the gate voltage of the supplemental current transistor may be selectively controlled by a CMOS multiplexer or other control circuitry. In alternative embodiments, the means for selectively providing supplemental current may be a p-MOS transistor, BJT transistor, or any other switching device known in the art that can selectively be turned on (i.e., made conductive) and turned off (i.e., made non-conductive).

The electronic circuit may also include a current limiter circuit that is connected to the reference current source and the source of the supplemental current transistor. The current limiter circuit acts to limit the maximum current that can flow through the electronic circuit and memory cell. This ensures that the hardware is not damaged by an overflow of current. In some embodiments, the current limiter circuit is implemented using a current mirror that includes a limiting current source and two p-channel MOSFET's that have coupled gates. In an embodiment, the source of the supplemental current transistor is connected to output of the current limiter circuit and the source of the supplemental current transistor is connected to the sensing voltage node.

The electronic circuit may also include a pre-charge transistor connected to the sensing voltage node. The pre-charge transistor may be implemented as its own transistor and used to pre-charge the sensing voltage node when the electronic circuit is being turned on. A source-follower circuit may be connected to the bit line and the sensing voltage node in order to maintain a fixed voltage on the bit line. In an embodiment, the source-follower circuit may include an operational amplifier, a first transistor and a current source in a common drain configuration, and a second transistor connected between the sensing voltage node and the bit line. An output of the operational amplifier may be connected to the gates of the first and second transistor. A positive input of the operational amplifier may be connected to a desired bit line voltage that is selectable by a user, and the negative input of the operational amplifier may be connected to the output of the common drain configuration (i.e., the source of the first transistor).

Operation of the circuit discussed above includes fixing a voltage on the bit line using the source follower circuit and detecting a transition of current in the memory cell from a magnitude greater than the reference current (i.e., a high current) to a magnitude less than the reference current (i.e., a low current). The operation includes applying a reference current to the bit line via the reference current source. The operation further includes activating the supplemental current transistor to provide a supplemental current to the bit line while the current in the memory cell is greater than the reference current. The memory cell may transition from its high state to a low state which causes the voltage at the sensing voltage node to rise. The rising voltage at the sensing voltage node (and at the source of the supplemental current transistor) causes the supplemental current transistor to turn off. The voltage at the sensing voltage node continues to rise while the reference current is greater than the memory cell current. When the voltage at the voltage sensing node becomes greater than the reference voltage of the comparator, the comparator changes its output from a first state to a second state, thus indicating transition of the current in the memory cell from a high state (in which the magnitude of the current in the memory cell is greater than the reference current) to a low state (in which the magnitude of the current in the memory cell is less than the reference current).

The circuit discussed above may also be used with external write and read circuitry. Specifically, the memory cell may be transitioned from a first state to a second state by an external write circuit. A read circuit may then read the memory cell to determine whether it is in the first state or the second state. Additionally, when the memory cell is transitioned from a first state (e.g., a high current state) to a second state (e.g., a low current state), a sensing voltage at a sensing voltage node is compared to a reference voltage. The sensing voltage is based on a first current received at the sensing voltage node from the supplemental current transistor and a second current received at the sensing voltage node from the reference current source. Further, the transition of the memory cell is verified when the memory cell is transitioned and causes the current in the memory cell to fall below the reference current and further causes the supplemental current transistor to deactivate. The result is that sensing voltage rises and exceeds the reference voltage which signals to the read circuit that a successful transition has occurred. Alternatively, if the write circuit transitions the memory cell and the read circuit does not receive a signal that indicates that the transition was successful, an error may be produced as an indication of a malfunction.

DETAILED DESCRIPTION

Reference will now be made to various embodiments, one or more examples of which are illustrated in the figures. The embodiments are provided by way of explanation of the invention, and are not meant as a limitation of the invention. For example, features illustrated or described as part of one embodiment may be used with another embodiment to yield still a further embodiment. It is intended that the present application encompass these and other modifications and variations as come within the scope and spirit of the invention.

Disclosed herein is a technology directed to non-volatile memory including a circuit that detects a transition of a memory cell from a first current state to a second current state. The disclosed technology can easily integrate with existing approaches of reading and detecting changes of states of a memory cell. Specifically, the disclosed technology involves adding minimal circuitry (e.g., a few transistors) to a sense amplifier to add and optimize current transition monitoring of a memory cell. More specifically, the present technology allows for the detection of the transition of a memory cell current from high-to-low and low-to-high in real time. This feature allows for the memory cell to be more accurately monitored and ultimately creates more reliable memory devices and data.

Figure 1:
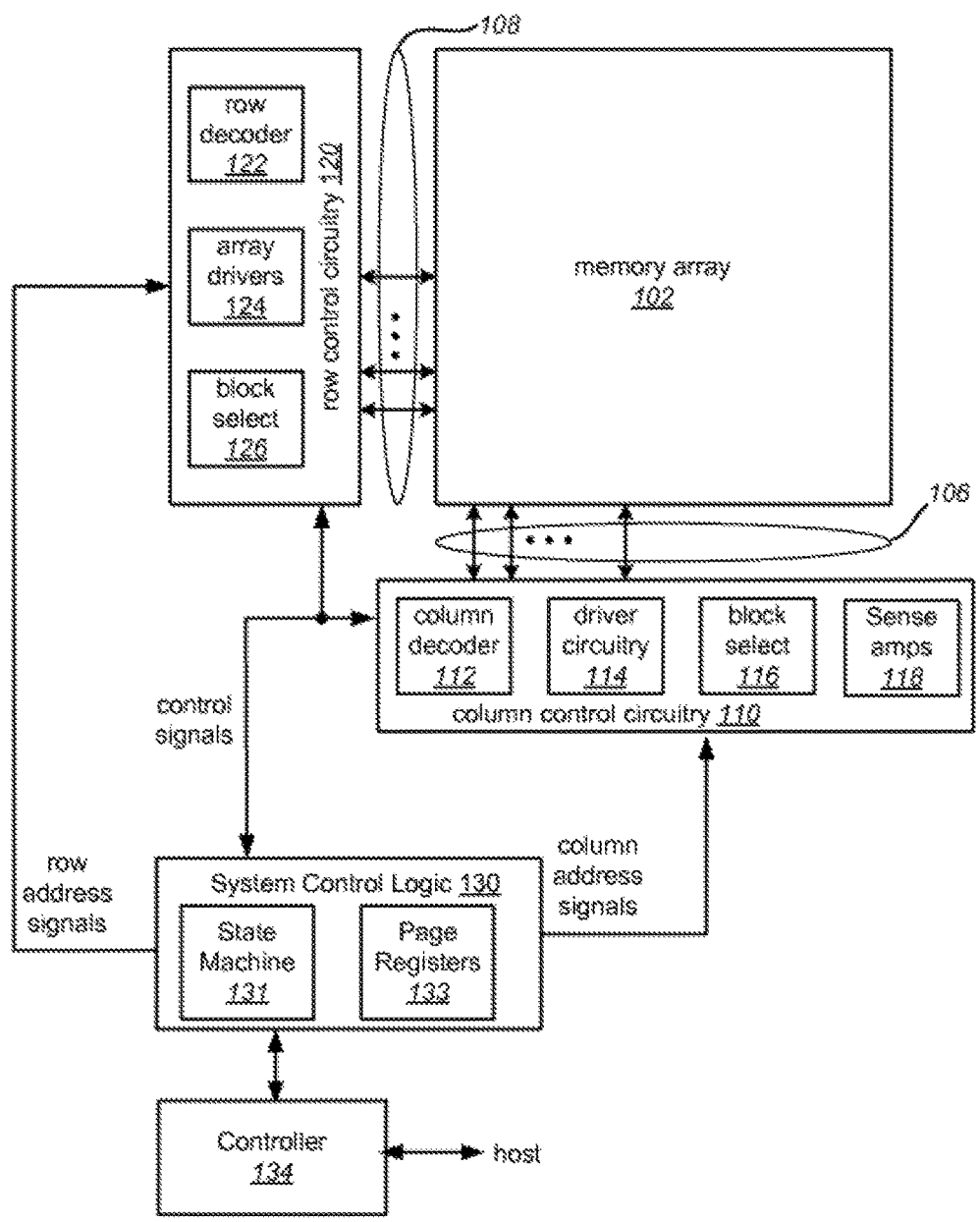
FIG. 1 is a block diagram of one embodiment of a non-volatile memory system.

FIG. 1 is a block diagram that depicts one example of a memory system 100 that can be used to implement embodiments of the disclosed technology. Memory system 100 includes a memory array 102, which can be a two or three-dimensional array of memory cells. In one embodiment, memory array 102 is a monolithic three dimensional memory array. The terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from system control logic circuit 130, and typically may include such circuits as row decoders 122, array drivers 124, and block select circuitry 126 for both reading and programming operations.

Memory system 100 also includes column control circuitry 110 whose input/outputs 106 are connected to respective bit lines of the memory array 102. Column control circuitry 110 receives a group of column address signals and one or more various control signals from system control logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133, and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120, and memory array 102 are formed on the same integrated circuit. For example, system control logic 130, column control circuitry 110, and row control circuitry 120 can be formed on the surface of a substrate. Memory array 102 may be a monolithic three-dimensional memory array formed above the substrate (and, therefore, above all or a portion of system control logic 130, column control circuitry 110, and row control circuitry 120). In some cases, a portion of the control circuitry can be formed on the same layers as some of the memory array. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124, and/or block select 126, alone or in any combination, can be considered control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer.

In another embodiment, memory cells are re-writable. For example, a rewriteable non-volatile memory cell can include a diode or other select device coupled in series or another fashion with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
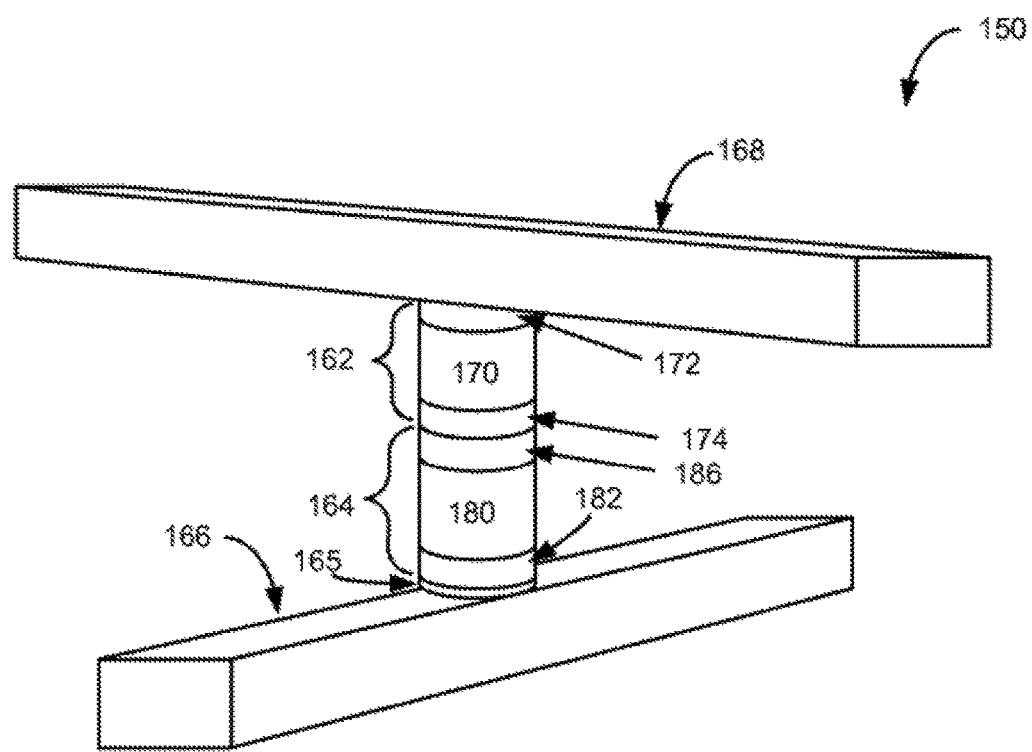
FIG. 2 is a simplified perspective view of one embodiment of a memory cell.

FIG. 2 is a simplified perspective view of one example of a memory cell 150 that includes a reversible resistance-switching element 162, a steering element 164, and a barrier 165 coupled in series and positioned between a first conductor 166 and a second conductor 168. Reversible resistance-switching element 162 includes a reversible resistance-switching material 170 having a resistance that may be reversibly switched between two or more states. In some embodiments, reversible resistance-switching material 170 may be formed from a metal oxide.

Various different metal oxides can be used. In one example, nickel oxide is used. In one embodiment, reversible resistance-switching material 170 includes at least a portion of a nickel oxide layer formed by selectively depositing nickel and then oxidizing the nickel layer. In other embodiments, nickel oxide itself may be selectively deposited. In other embodiments Hafnium oxide may be deposited by an atomic layer deposition process using a precursor containing Hafnium. Other materials may be selectively deposited, and annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described in Rose et al., U.S. Pat. No. 5,541,869. Another class of material is taught by Ignatiev et al. in U.S. Pat. No. 6,473,332: these are perovskite materials such as $Pr_{1-x}Ca_x$-$MnO_3$ (PCMO), $La_{1-x}Ca_xMnO_3$ (LCMO), $LaSrMnO_3$ (LSMO), or $GdBaCo_xXO_y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164. While FIG. 2 shows one example of a memory cell, no one particular type or structure of a memory cell is required for the technology disclosed herein. Many different types of memory cells can be used.

Figure 3:
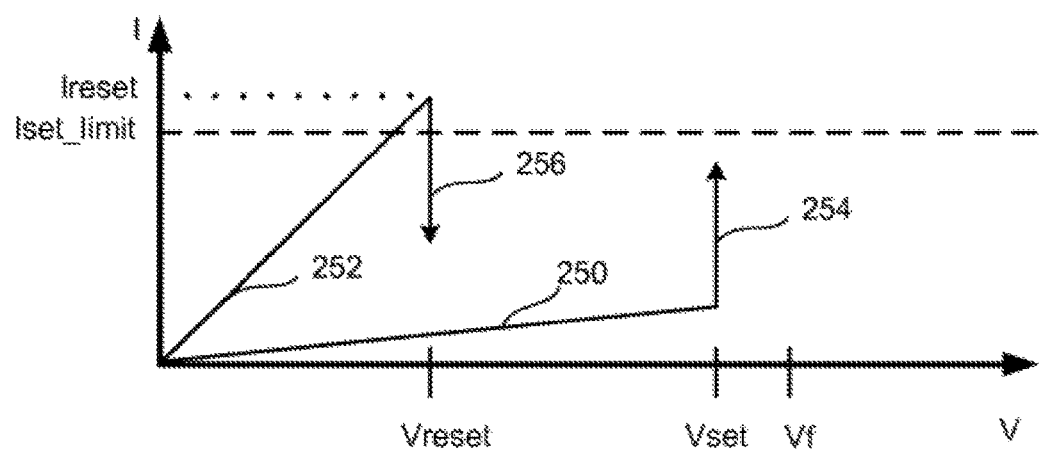
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, $V_f$ (the forming voltage) is needed to SET the device. After that, VSET can be used. The forming voltage $V_f$ may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
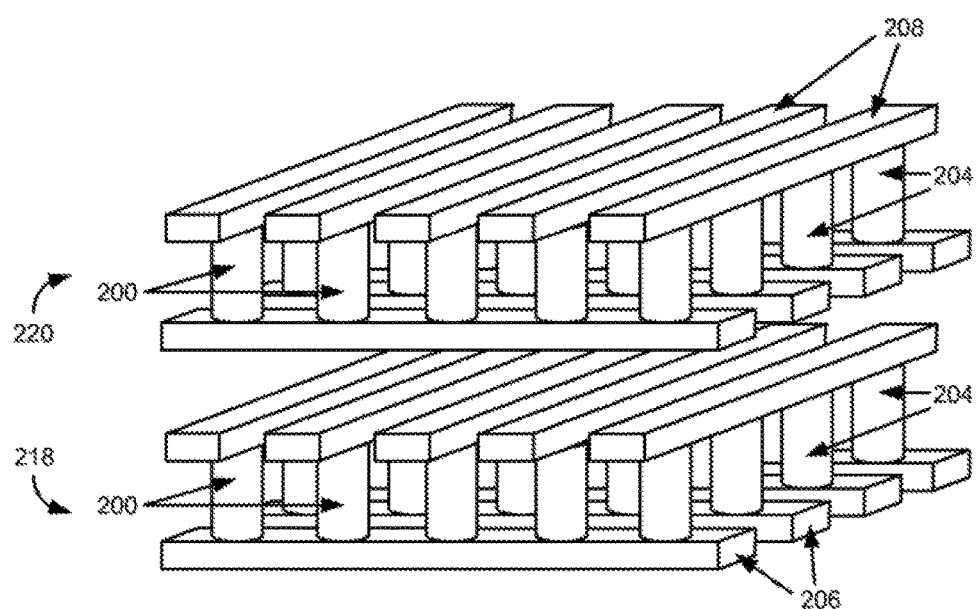
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
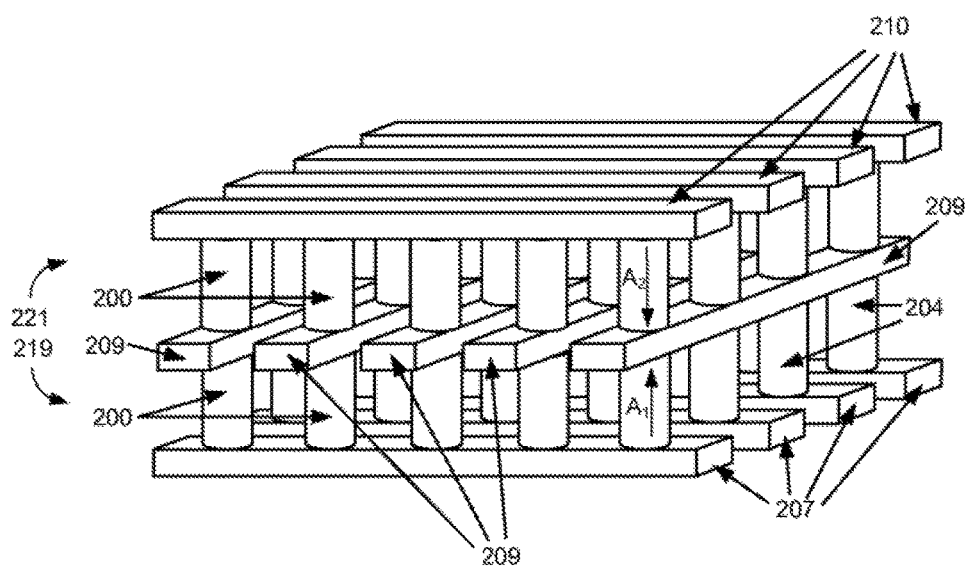
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B.

In the embodiment of FIG. 4B, the diodes (or other steering devices) on adjacent memory levels point in opposite directions in one example. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there are additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry.

Figure 5:
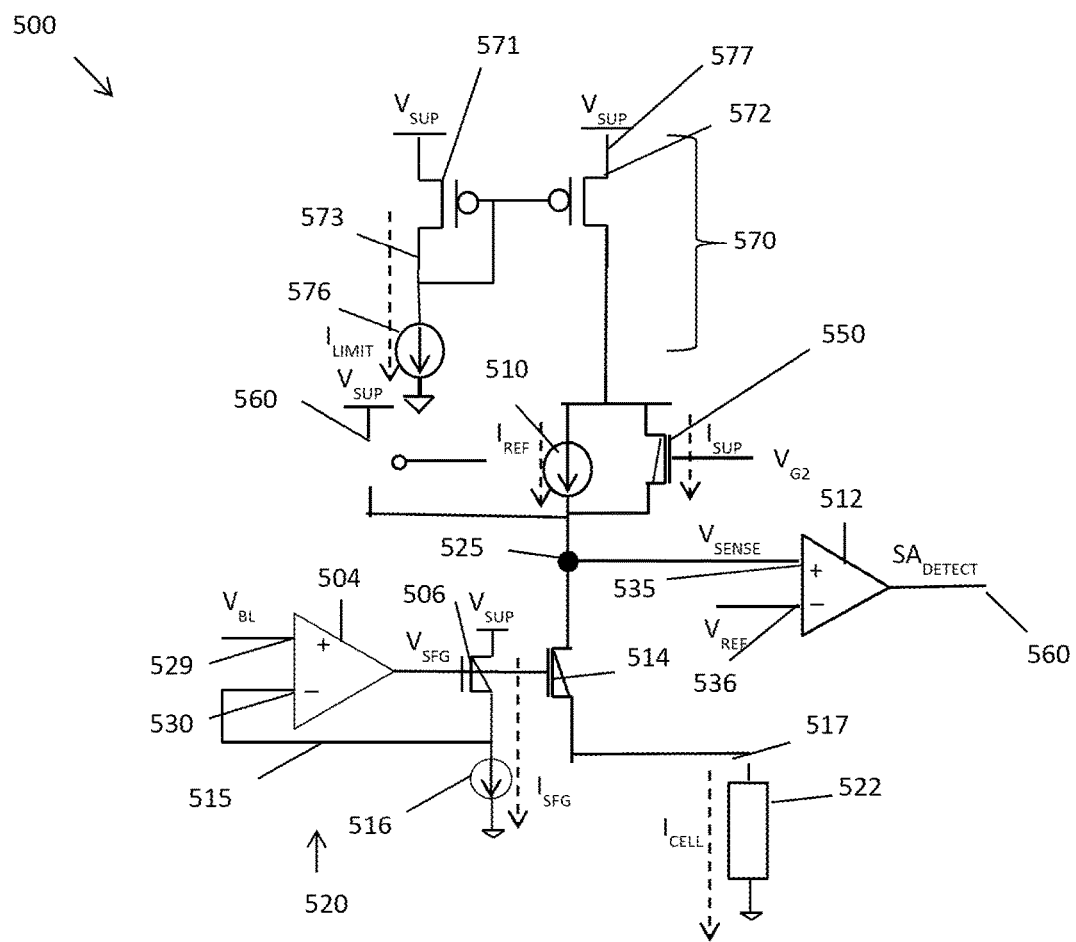
FIG. 5 is a schematic diagram of a circuit used to detect a transition in a memory cell in accordance with an illustrative embodiment.

FIG. 5 is a schematic diagram of a circuit used to detect a transition in a memory cell in accordance with an illustrative embodiment. The memory cell 522 has a memory cell current $I_{CELL}$ that is monitored by circuit 500. Circuit 500 includes a source-follower circuit 520 that is connected to a bit line 517 and to a sensing voltage node 525. In an embodiment, the source-follower circuit 520 is configured to maintain a fixed voltage on the bit line 517. The source-follower circuit 520 includes an operational amplifier 504 and n-channel MOSFET (nMOS) transistors 506 and 514. The operational amplifier 504, nMOS transistor 506, and a feedback path 515 form an operational amplifier loop. A target bit-line voltage is provided at a first terminal 529 (e.g., the positive input) of the operational amplifier 504, and the feedback path 515 is connected to a second terminal 530 (e.g., the negative input) of the operational amplifier 504.

The operational amplifier 504 includes an output that is connected to a respective gate of each of the nMOS transistors 506 and 514. The operational amplifier 504 is configured to output a common voltage $V_{SFG}$ to the gates of the nMOS transistors 506 and 514 so that a voltage at a source of the transistors 506, 514 follows the voltage $V_{SFG}$ at the gates of transistors 506, 514. A current source 516 provides the current $I_{SFG}$ which flows through the nMOS transistor 506 at a similar level as the current which flows through the nMOS transistor 514. This creates a similar gate-to-source voltage $V_{GS}$ for each of the two nMOS transistors 506, 514, and creates a voltage on the feedback path 515 that is substantially equal to both the target bit-line voltage at first terminal 529 and to a voltage $V_{BL}$ on the bit line 517. Bit line 517 is connected between a drain of the nMOS transistor 514 and the memory cell 522. The voltage $V_{BL}$ on the bit line 517 follows $V_{SFG}$, the source-follower gate voltage, which in turn follows the target bit-line voltage at the first terminal 529. The drain of the nMOS transistor 506 is coupled to a supply voltage $V_{SUP}$. The drain of the nMOS transistor 514 is connected to the sensing voltage node 525.

The sensing voltage node 525 is also directly connected to each of a reference current source 510, a supplemental current transistor 550, and a pre-charge transistor 560. The reference current source 510 is connected between a current limiter circuit 570 and the sensing voltage node 525 and provides a reference current, $I_{REF}$, to the sensing voltage node 525. In an embodiment, the reference current source 510 is a means for providing a reference current. The means for providing a reference current may be an active current source, a passive current source, a constant current diode, a Zener diode current source, an LED current source, a transistor current source with diode compensation, a current mirror, an operational amplifier current source, a voltage regulator current source, a combination thereof, or any other current source that is known in the art.

The supplemental current transistor 550 may be implemented as an n-MOS transistor. As such, the supplemental current transistor 550 is a means for selectively providing supplemental current to the bit line associated with the memory cell. In an embodiment, the means for selectively providing supplemental current further includes a means for selectively controlling the supplemental current in response to an amount of current on the bit line exceeding an amount of the reference current. In alternative embodiments, the supplemental current transistor 550 may be a p-MOS transistor, a BJT transistor, or any other switching device known in the art that can selectively be turned on (i.e., made conductive) and turned off (i.e., made non-conductive) so as to selectively pass a supplemental current.

The supplemental current transistor 550 is connected in parallel to the reference current source 510 and between the current limiter circuit 570 and the sensing voltage node 525. The supplemental current transistor 550 is configured to selectively provide a supplemental current $I_{SUP}$ to the sensing voltage node 525. The supplemental current $I_{SUP}$ is in addition to the reference current $I_{REF}$ provided by the reference current source 510. The supplemental current $I_{SUP}$ is provided in response to the magnitude of the memory cell current $I_{CELL}$ during a first current state (e.g., a high state) exceeding the magnitude of the reference current $I_{REF}$. A source of the supplemental current transistor 550 is connected to an output of the current limiter circuit 570 and a drain of the supplemental current transistor 550 is directly connected to the sensing voltage node 525. In an embodiment, the voltage source $V_{G2}$ may be connected to an output of a CMOS multiplexer or other control circuitry. The gate voltage of the supplemental current transistor 550 may be automatically controlled by the CMOS multiplexer or other control circuitry which selectively applies a voltage to the gate of the supplemental current transistor 550. In one embodiment, the CMOS multiplexer or other control circuitry selectively switches the gate voltage $V_{G2}$ from a voltage of zero (which deactivates the supplemental current transistor) and $V_{SFG}$ (which activates the supplemental current transistor) based on a determined state of the memory system.

The supplemental current transistor 550 allows for real time detection of a transition in the memory cell using a circuit configuration with minimal complexity that is capable of implementation with existing sensing amplifier circuits. Additionally, the real time detection allows for the circuitry to immediately verify or detect any wanted or unwanted transitions within the memory cell, which allows for faster writing and reading operations.

The current limiter circuit 570 of the circuit 500 includes two mirrored p-channel MOSFET (pMOS) transistors 571 and 572 and a limiting current source 576. The source nodes of pMOS transistors 571 and 572 are connected to a power supply having a supply voltage $V_{SUP}$. The limiting current source 576 provides a fixed current $I_{LIMIT}$ in a path 573 which is mirrored to a path 577 via the pMOS transistors 571 and 572. (A pMOS transistor is depicted by a transistor symbol with a small circle at the gate node, while an nMOS transistor is depicted by a transistor symbol without a small circle at the gate node.) The gate nodes of pMOS transistors 571 and 572 are coupled together. The drain node of the pMOS transistor 571 is coupled to the limiting current source 576, and the drain node of the pMOS transistor 572 is directly coupled to both the reference current source 510 and the drain of the supplemental current transistor 550.

A drain of the pre-charge transistor 560 is connected to the sensing voltage node 525. A gate of the pre-charge transistor 560 is connected to a pre-charge node that is configured to receive a pre-charge activation voltage that activates the pre-charge transistor 560, causing the supply voltage $V_{SUP}$ connected to the source of pre-charge transistor 560 to be supplied to the sensing voltage node 525 during a pre-charge phase of a read or write operation for the memory cell 522.

A comparator 512 includes a positive input 535 connected to the sensing voltage node 525 which thereby receives a voltage $V_{SENSE}$ from the sensing voltage node 525. In an embodiment, the comparator 512 is an operational amplifier. The comparator 512 further includes a negative input 536 that receives a fixed reference voltage $V_{REF}$. The comparator 512 is thereby configured to compare the voltage $V_{SENSE}$ from the sensing voltage node 525 to the fixed reference voltage $V_{REF}$ and output a corresponding detection signal $SA_{DETECT}$ at a detection node 560. The comparator 512 is a means for detecting a transition of the memory cell from a first current state to a second current state via the comparison of to a sensing voltage and a reference voltage. In alternative embodiments, the means for detecting a transition from a first current state to a second current state via the comparison of the sensing voltage to a reference voltage can be implemented by software, multiple operational amplifiers, transistors, a combination thereof, or any other means known in the art.

Figure 6:
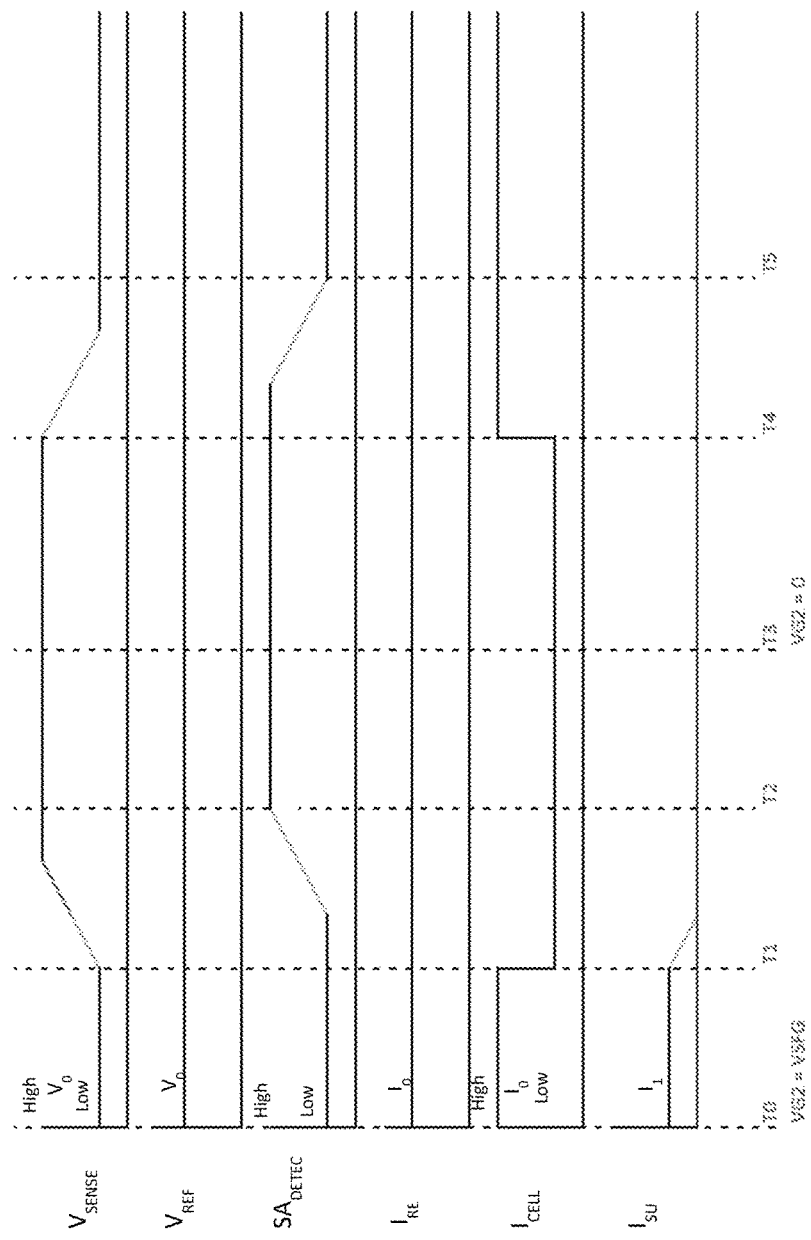
FIG. 6 is a timing diagram for reference variables in a memory cell current transition detection circuit in accordance with an illustrative embodiment.

FIG. 6 is a timing diagram for reference variables in a memory cell current transition detection circuit in accordance with an illustrative embodiment. More specifically, FIG. 6 depicts a timing diagram for the detection of the transitions of the memory cell current $I_{CELL}$. That is, the timing diagram depicts the memory cell current $I_{CELL}$ (i.e., the current that flows through the memory cell 522) transitioning from high to low and low to high in accordance with an illustrative embodiment. It will be appreciated that the terms "high" and "low" are in respect to a reference variable. For example, a high memory cell current $I_{CELL}$ means that the memory cell current $I_{CELL}$ is greater than the reference current $I_{REF}$ (i.e., the current that is generated by the reference current source 510), and a low memory cell current $I_{CELL}$ means that the memory cell current $I_{CELL}$ is less than the reference current $I_{REF}$.

Beginning on the left of FIG. 6, the memory cell current $I_{CELL}$ is greater than a reference current $I_{REF}$ that is set at a constant current $I_0$ (e.g., the memory cell is in a SET state). Since $I_{CELL}$ is greater than $I_{REF}$ in the initial condition, the circuit will detect when $I_{CELL}$ transitions to less than $I_{REF}$. In order to detect the transition of $I_{CELL}$ from high to low, the supplemental current transistor 550 is activated at T0 (i.e., made conductive) by applying the gate voltage $V_{G2}$ to the gate of the supplemental current transistor 550. In some embodiments, the gate voltage $V_{G2}$ may be equal to the source-follower voltage $V_{SFG}$. In alternative embodiments, $V_{G2}$ is of any magnitude that activates the transistor. Since $I_{CELL}$ is greater than $I_{REF}$, the supplemental current transistor 550 will supply the supplemental current $I_{SUP}$ to the voltage sensing node 525. In so doing, the voltage of the bit-line 517 is maintained the target bit line voltage.

At T1, the memory cell current $I_{CELL}$ drops below $I_{REF}$ (e.g., the memory cell 522 is RESET). At that time, the voltage $V_{SENSE}$ at the voltage sensing node 525 begins to rise in magnitude and shuts off the supplemental current transistor 550 (i.e., deactivates the supplemental current transistor). In other words, $I_{SUP}$ becomes zero because the gate voltage $V_{G2}$ as compared to its source voltage (i.e., $V_{SENSE}$) is no longer great enough to form a conducting channel in the supplemental current transistor 550 (i.e., the supplemental current transistor 550 is deactivated). After $I_{SUP}$ becomes zero, $V_{SENSE}$ continues to rise because $I_{REF}$ is larger than $I_{CELL}$. Once $V_{SENSE}$ becomes larger than the fixed reference voltage $V_{REF}$, the comparator 512 transitions its output $SA_{DETECT}$ from low to high and the memory cell current ($I_{CELL}$) transition is detected. The entire detection time for the transition from low to high for $I_{CELL}$ occurs over a time period of T1 to T2. In some embodiments, the time period of T1 to T2 is about 50 nano-seconds. In alternative embodiments, the time period of T1 to T2 is more or less than 50 nano-seconds.

Continuing with FIG. 6 after T2, the memory cell current $I_{CELL}$ is less than $I_{REF}$ (e.g., the memory cell is RESET). In order to detect the transition of $I_{CELL}$ from low to high, the gate voltage $V_{G2}$ of the supplemental current transistor 550 is lowered to zero at T3. In alternative embodiments, $V_{G2}$ can be lowered to any magnitude that ensures that the supplemental current transistor 550 will stay deactivated throughout the transition. Since $I_{SUP}$ was already zero before lowering the magnitude of $V_{G2}$, the currents in the circuit are not affected.

At T4, the memory cell current $I_{CELL}$ becomes greater than $I_{REF}$, thus transitioning from a low state to a high state (e.g., the memory cell 522 is SET). The voltage $V_{SENSE}$ at the voltage sensing node 525 begins to decrease in magnitude. Once $V_{SENSE}$ becomes less than the fixed reference voltage $V_{REF}$, the comparator 512 transitions its output $SA_{DETECT}$ from high to low and the transition is detected. The entire detection time for the transition from high to low for $I_{CELL}$ occurs over a time period of T4 to T5. In some embodiments, the time period of T4 to T5 is about 50 nano-seconds. In alternative embodiments, the time period of T4 to T5 is more or less than 50 nano-seconds. After T5 the cycle may be repeated.

In other applications, it may be beneficial to simply read the state that the memory cell is in. This may be done after a write cycle to ensure that all of the memory cells were properly SET or RESET. The state of the memory cell may be read by setting the gate voltage $V_{G2}$ of the supplemental current transistor 550 to zero. If $I_{CELL}$ is less than $I_{REF}$, then $V_{SENSE}$ will be greater than $V_{REF}$ and $SA_{DETECT}$ will be high. However, if $I_{CELL}$ is greater than $I_{REF}$, then $V_{SENSE}$ will be less than $V_{REF}$ and $SA_{DETECT}$ will be low. A sensing circuit, logic board, or other computer device may then read $SA_{DETECT}$ and detect a current state of the memory cell. Additionally, the sensing circuit may verify that the memory cell is in the correct state and produce and error if it is not.

Figure 7A:
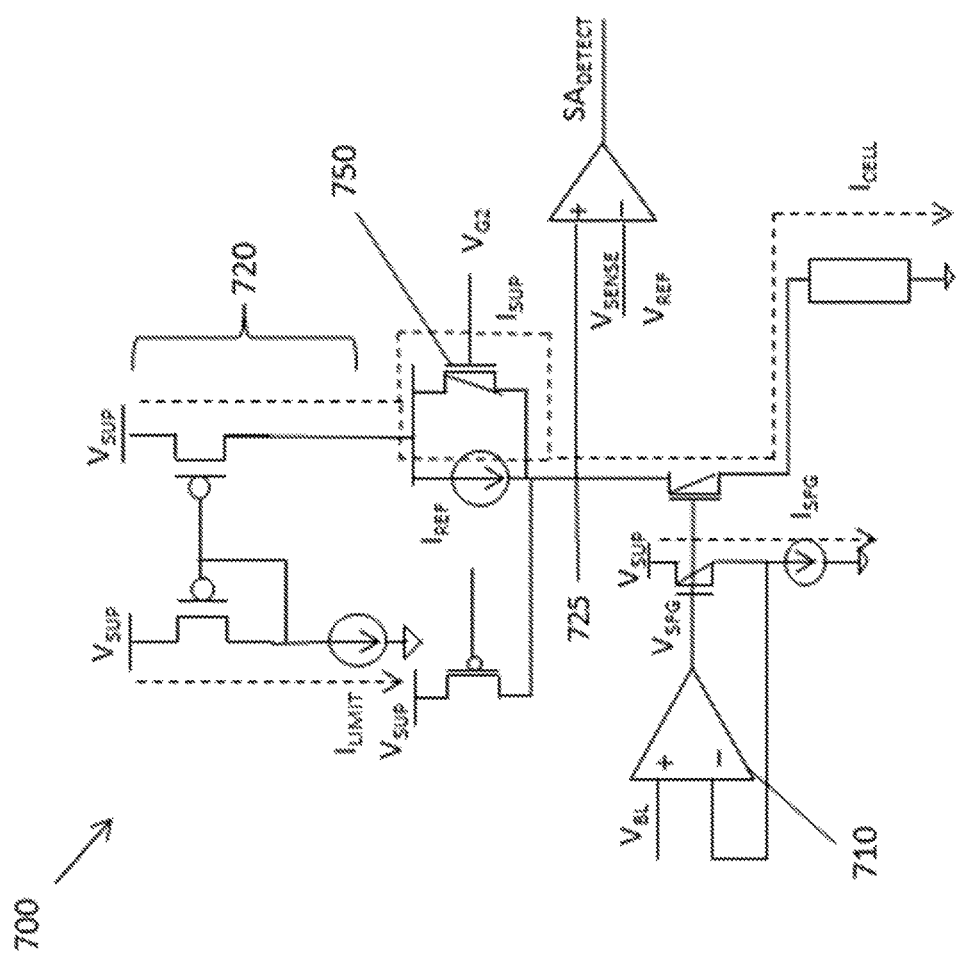
FIG. 7A is a schematic diagram of a circuit used to detect a transition in a memory cell that depicts current flow during a first state of the circuit in accordance with an illustrative embodiment.
Figure 7B:
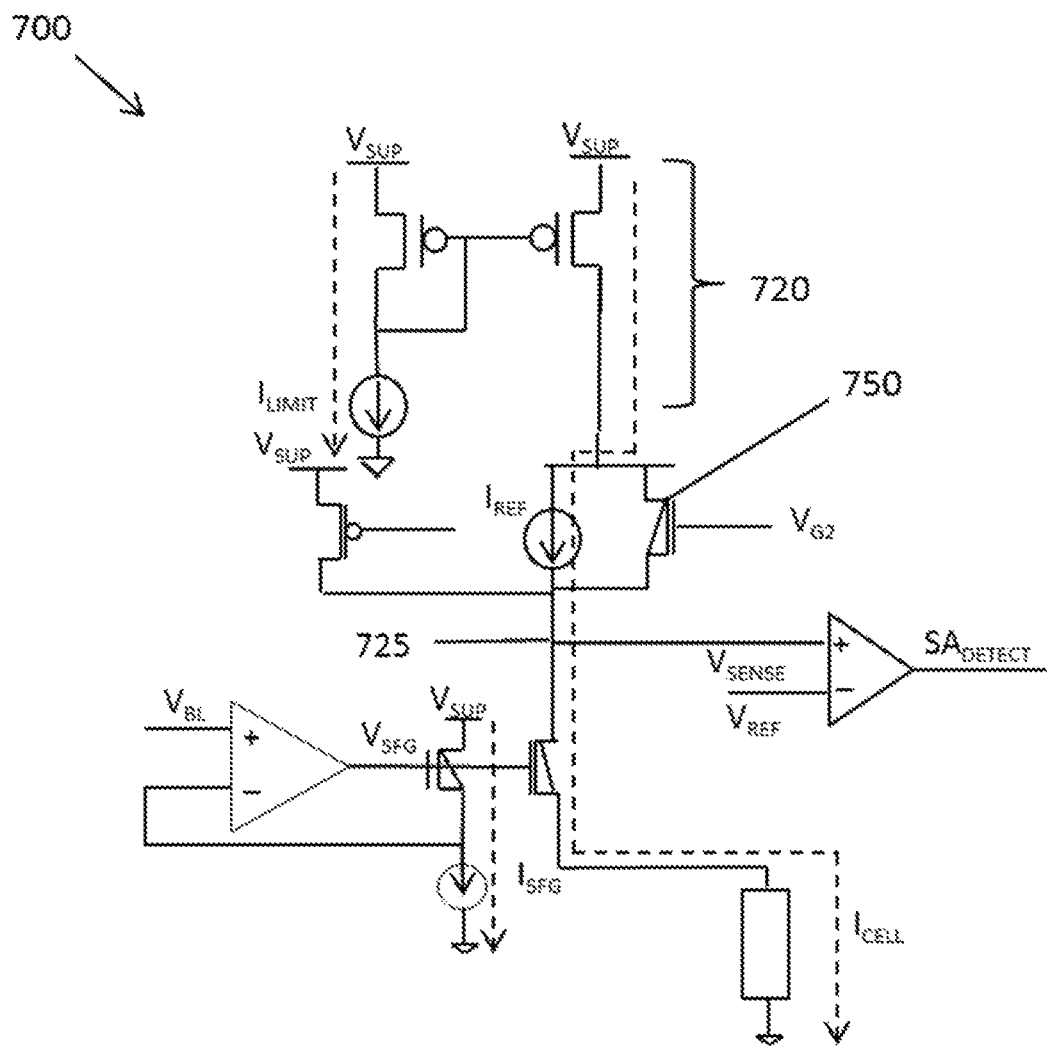
FIG. 7B is a schematic diagram of a circuit used to detect a transition in a memory cell that depicts current flow during a second state of the circuit in accordance with an illustrative embodiment.

FIG. 7A is a schematic diagram of a circuit used to detect a transition in a memory cell that depicts current flow during a first state of the circuit in accordance with an illustrative embodiment. FIG. 7B is a schematic diagram of a circuit used to detect a transition in a memory cell that depicts current flow during a second state of the circuit in accordance with an illustrative embodiment. More specifically, FIG. 7A depicts the circuit 700 when a supplemental current transistor 750 is activated or on (i.e., has current flow). FIG. 7B depicts the circuit when the supplemental current transistor 750 is deactivated or off (i.e., does not have current flow).

In FIG. 7A, the gate voltage $V_{G2}$ of the supplemental current transistor 750 is turned on. In other words, $V_{G2}$ has a large enough magnitude to overcome the intrinsic threshold voltage and creates a conductive channel within the supplemental current transistor 750. In an embodiment, $V_{G2}$ has a magnitude that is equal to the voltage $V_{SFG}$ of an output of a source follower circuit 710. In this state, the memory cell current $I_{CELL}$ is greater than the reference current $I_{REF}$. Thus, the supplemental current transistor 750 supplies a supplemental current, $I_{SUP}$ (i.e., the difference in magnitude of $I_{CELL}$ and $I_{REF}$), that is needed to satisfy Kirchhoff's current law at the voltage sensing node 725.

In FIG. 7B, the supplemental current transistor 750 is turned off (i.e., no current is flowing through the supplemental current transistor 750). The state depicted in FIG. 7B may occur in at least two different points in time. For example, the supplemental current transistor 750 is turned off when $I_{CELL}$ transitions from larger than $I_{REF}$ to smaller than $I_{REF}$, and when the gate voltage $V_{G2}$ is turned off (or does not exceed the intrinsic threshold voltage of the supplemental current transistor 750). In either of these situations, the voltage difference between the gate voltage $V_{G2}$ and the voltage $V_{SENSE}$ at the voltage sensing node 725 is not great enough to overcome the inherent threshold value and a conductive channel is not present. In other words, $I_{SUP}$ is equal to zero. In this state, the voltages would fluctuate in order to ensure that Kirchhoff's current law is satisfied at the voltage sensing node 725.

Also depicted in FIGS. 7A and 7B are currents that do not directly flow into the memory cell, e.g., currents $I_{SFG}$ and $I_{LIMIT}$. $I_{SFG}$ is a current that allows the source follower 710 to operate and maintain a constant output voltage $V_{SFG}$. $I_{LIMIT}$ is a limiting current that is used in the current mirror 720 and ensures that the memory cell current $I_{CELL}$ does not exceed the defined limiting current $I_{LIMIT}$. For example, if the memory current $I_{CELL}$ current exceeds $I_{LIMIT}$, the bit line voltage $V_{BL}$ drops which decreases $I_{CELL}$. Thus, $I_{LIMIT}$ and the current mirror 720 ensure that the hardware is not damaged when operating the circuit.

Figure 8:
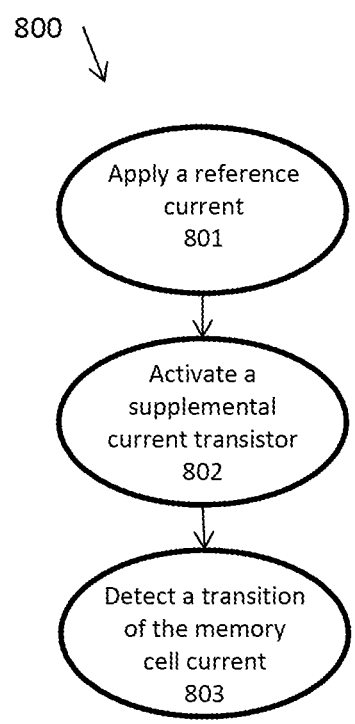
FIG. 8 depicts a method of operation of a circuit used to detect a transition in a memory cell in accordance with an illustrative embodiment.

FIG. 8 depicts a method of operation 800 of a circuit used to detect a transition in a memory cell in accordance with an illustrative embodiment. It is to be appreciated that the following operations may include other steps in the application of the operation. For example, applying supply voltages and setting the limiting and reference currents may be included in the operation. In an embodiment, $I_{LIMIT}$ and $I_{REF}$ are constant currents created by constant current sources. In another embodiment, $I_{LIMIT}$ and $I_{REF}$ are in the microamperes range from 10 microamperes to 110 microamperes. In the method of operation 800 of the circuit, $I_{LIMIT}$ is greater in magnitude than $I_{REF}$.

In an operation 801, a reference current source applies a reference current to a voltage sensing node and a bit line of a sense amplifier. For example, using the circuit 500 of FIG. 5, the reference current $I_{REF}$ is supplied to the voltage sensing node 525 and onto the bit-line 517. In an operation 802, a supplemental current transistor activates (i.e., is made conductive) and applies a supplemental current to the voltage sensing node and the bit line of the sense amplifier. For example, again using the circuit 500 of FIG. 5, the supplemental current transistor 550 is activated and thus supplies a supplemental current $I_{SUP}$ to the voltage sensing node 525 and onto the bit-line 517.

In an operation 803, a detection component detects a transition of a memory cell current from a first state to a second state. For example, again using the circuit 500 of FIG. 5, a transition of the memory cell current $I_{CELL}$ from high to low is detected (e.g., by a read circuit) by reading the output of the circuit $SA_{DETECT}$. In an embodiment, the memory cell current is transitioned from an external write circuit. The memory cell current $I_{CELL}$ is considered high when it is greater than the reference current $I_{REF}$ and is considered low when it is less than the reference current $I_{REF}$. The voltage $V_{SENSE}$ is based on the current received at the sensing voltage node from the supplemental current transistor and the current received at the sensing voltage node from the reference current source.

When the memory cell current $I_{CELL}$ transitions from high to low, the voltage $V_{SENSE}$ at the voltage sensing node 525 begins to rise in magnitude and turns off the supplemental current transistor 550 (i.e., the conductive channel goes away). In other words, the supplemental current $I_{SUP}$ becomes zero. The voltage $V_{SENSE}$ continues to rise and when it becomes greater than the reference voltage $V_{REF}$, the output $SA_{DETECT}$ transitions from one state to another (e.g., a low voltage to a high voltage). The transition of $SA_{DETECT}$ is a verification signal that indicates that a transition has occurred. In an embodiment, the detection component is a comparator such as an operational amplifier that compares $V_{REF}$ and $V_{SENSE}$. If a transition in $SA_{DETECT}$ is detected then the transition of the memory cell state is verified. However, if a transition in $SA_{DETECT}$ is not detected within a set period of time after the write operation, an error may be produced by the read circuit. Alternatively, if a transition in $SA_{DETECT}$ is detected when the memory cell state was not being transitioned, an error may be produced by an external circuit to indicate a malfunction in the device.

The following description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
   a memory cell;
   a bit line connected to the memory cell;
   a sensing voltage node connected to the bit line;
   a comparator having a first input connected to the sensing voltage node and a second input connected to a reference voltage, the comparator circuit configured to:
      compare a voltage at the sensing voltage node to the reference voltage; and
      output a detection signal based on the comparison of the voltage at the sensing voltage node to the reference voltage;
   a reference current source connected to the sensing voltage node and configured to provide a reference current to the sensing voltage node;
   a supplemental current transistor connected to the sensing voltage node and configured to provide a supplemental current to the sensing voltage node in response to a current through the memory cell exceeding the reference current, the reference current source connected in parallel to the supplemental current transistor; and
   a current limiter circuit connected to the reference current source and the supplemental current transistor, wherein the reference current source and the supplemental current transistor are connected in parallel between the current limiter circuit and the sensing voltage node.

2. The apparatus of claim 1, wherein the current limiter circuit comprises a limiting current source connected to a current mirror circuit, and wherein the current mirror circuit is further connected to both the reference current source and the supplemental current transistor.

3. The apparatus of claim 1, further comprising a pre-charge transistor connected to the sensing voltage node and configured to pre-charge the sensing voltage node prior to detection of a memory cell transition.

4. The apparatus of claim 3, wherein the pre-charge transistor is separate from the supplemental current transistor.

5. The apparatus of claim 1, wherein the comparator comprises an operational amplifier, and wherein the sensing voltage node is connected to a positive terminal of the operational amplifier and the reference voltage is connected to a negative terminal of the operational amplifier.

6. The apparatus of claim 1, further comprising a source-follower circuit connected to the bit line and the sensing voltage node, wherein the source follower circuit is configured to maintain a fixed voltage on the bit line.

7. The apparatus of claim 6, wherein the source-follower circuit comprises:
 an operational amplifier having a positive input, a negative input, and an output; and
 a first transistor having a gate connected to the output of the operational amplifier.

8. An apparatus comprising:
 a memory cell;
 a bit line connected to the memory cell;
 a sensing voltage node connected to the bit line;
 a comparator having a first input connected to the sensing voltage node and a second input connected to a reference voltage, the comparator circuit configured to:
  compare a voltage at the sensing voltage node to the reference voltage; and
  output a detection signal based on the comparison of the voltage at the sensing voltage node to the reference voltage;
 a reference current source connected to the sensing voltage node and configured to provide a reference current to the sensing voltage node;
 a supplemental current transistor connected to the sensing voltage node and configured to provide a supplemental current to the sensing voltage node in response to a current through the memory cell exceeding the reference current, the reference current source connected in parallel to the supplemental current transistor; and
 a source-follower circuit connected to the bit line and the sensing voltage node, wherein the source follower circuit is configured to maintain a fixed voltage on the bit line, and wherein the source-follower circuit comprises:
  an operational amplifier having a positive input, a negative input, and an output; and
  a first transistor having a gate connected to the output of the operational amplifier, wherein the first transistor further comprises a drain connected to the sensing voltage node and a source connected to the memory cell via the bit line.

9. The apparatus of claim 7, wherein the source-follower circuit further comprises:
 a second transistor having a gate connected to the output of the operational amplifier; and
 a feedback path connected between a terminal of the operational amplifier and a source of the second transistor.

10. The apparatus of claim 1, wherein the supplemental current transistor comprises a drain connected to an output of the current limiter circuit and a source connected to the sensing voltage node.

11. A method comprising:
 applying a reference current to a bit line associated with a memory cell;
 during a first current state of the memory cell, activating a supplemental current transistor to provide supplemental current to the bit line associated with the memory cell;
 detecting a transition of the memory cell from the first current state to a second current state in response to an amount of current on the bit line falling below a level of the reference current, wherein the amount of current on the bit line falling below the amount of the reference current causes the supplemental current transistor to deactivate and further causes a sensing voltage received at a comparator to exceed a reference voltage; and
 limiting a maximum current on the bit line using a current limiter circuit, wherein the current limiter circuit comprises a limit current source and a current mirror connected to both the supplemental current transistor and a source of the reference current.

12. The method of claim 11, wherein the supplemental current is provided in response to a magnitude of a current in the memory cell during the first current state exceeding a magnitude of the reference current.

13. The method of claim 11, further comprising fixing a voltage on the bit line using a source-follower circuit.

14. The method of claim 11, wherein the reference current is supplied by a constant current source, and wherein the supplemental current transistor is connected in parallel to the constant current source.

15. The method of claim 11, wherein the comparator is an operational amplifier having the reference voltage connected to a first input of the operational amplifier, and wherein the sensing voltage is connected to a second input of the operational amplifier; and
 wherein the transition causes an output of the operational amplifier to transition from a first voltage to a second voltage higher than the first voltage.

16. An apparatus comprising:
 means for applying a reference current to a bit line associated with a memory cell;
 means for selectively providing supplemental current to the bit line associated with the memory cell, wherein the means for selectively providing supplemental current further comprises means for deactivating the supplemental current in response to an amount of current on the bit line exceeding an amount of the reference current;
 means for detecting a transition of the memory cell from a first current state to a second current state in response to a sensing voltage exceeding a reference voltage, wherein the sensing voltage is dependent on the amount of current on the bit line; and
 means for limiting a maximum current on the bit line, wherein the means for limiting comprises a limit current source and a current mirror connected to both the means for selectively providing supplemental current and the means for applying the reference current.

17. A method comprising:
 programming a memory cell, wherein programming the memory cell comprises transitioning the memory cell from a first state to a second state;
 performing an operation to determine whether the memory cell is in the first state or the second state, wherein performing the operation comprises comparing a sensing voltage at a sensing voltage node to a reference voltage, wherein the sensing voltage is based on a first current received at the sensing voltage node from a supplemental current transistor and a second current received at the sensing voltage node from a reference current source, and wherein a combination of the first current and the second current is limited by a current limiter circuit, wherein the current limiter circuit comprises a limit current source and a current mirror connected to both the supplemental current transistor and a source of the reference current.

18. The method of claim 17, wherein the operation further comprises verifying whether the memory cell has transitioned from the first state to the second state, wherein transition to the second state causes an amount of current on a bit line to fall below an amount of the second current from the reference current source, and wherein transition to the second state causes the supplemental current transistor to deactivate and further causes the sensing voltage to exceed the reference voltage.

19. The method of claim 18, further comprising producing an error if the memory cell is verified to not be in the second state after the programming the memory cell.

* * * * *